(12) United States Patent
Haishi et al.

(10) Patent No.: US 9,636,877 B2
(45) Date of Patent: *May 2, 2017

(54) METHOD FOR PRODUCTION OF TRANSPARENT CONDUCTIVE FILM

(71) Applicant: NITTO DENKO CORPORATION, Ibaraki-shi, Osaka (JP)

(72) Inventors: Motoki Haishi, Ibaraki (JP); Tomotake Nashiki, Ibaraki (JP); Tomonori Noguchi, Ibaraki (JP); Yoshifumi Asahara, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/052,453

(22) Filed: Oct. 11, 2013

(65) Prior Publication Data

US 2014/0035193 A1 Feb. 6, 2014

Related U.S. Application Data

(62) Division of application No. 13/280,806, filed on Oct. 25, 2011, now Pat. No. 8,734,936.

(30) Foreign Application Priority Data

Nov. 5, 2010 (JP) ................................ 2010-248842
Jun. 21, 2011 (JP) ................................ 2011-137003

(51) Int. Cl.
*B05D 3/02* (2006.01)
*B29C 71/02* (2006.01)
(Continued)

(52) U.S. Cl.
CPC ............ *B29C 71/02* (2013.01); *C23C 14/086* (2013.01); *C23C 14/5806* (2013.01);
(Continued)

(58) Field of Classification Search
CPC ........................ C23C 14/086; C23C 14/5806
See application file for complete search history.

(56) References Cited

U.S. PATENT DOCUMENTS 4,835,061 A 5/1989 Ohta et al.
5,011,585 A 4/1991 Brochot et al.
(Continued)

FOREIGN PATENT DOCUMENTS

CN 101417517 A 4/2009
CN 101752025 A 6/2010
(Continued)

OTHER PUBLICATIONS

Chinese Office Action dated Jan. 17, 2014, issued in corresponding Chinese application No. 201310255891.0, w/ English translation (19 pages).
(Continued)

*Primary Examiner* — Nathan Empie
(74) *Attorney, Agent, or Firm* — Westerman, Hattori, Daniels & Adrian, LLP

(57) ABSTRACT

A method for producing a transparent conductive film includes heat-treating a transparent conductive film comprising a transparent film substrate and a transparent conductive laminate including a first transparent conductive layer and a second transparent conductive layer, so that the first and the second transparent conductive layers in the transparent conductive film are crystallized, wherein the first transparent conductive layer is a first amorphous layer comprising indium oxide or an indium-based complex oxide having a tetravalent metal element oxide, the second transparent conductive layer is a second amorphous layer comprising an indium-based complex oxide having a tetravalent metal element oxide, wherein each of the first and the second contents of the tetravalent metal element oxide content is expressed by the formula: {the amount of the tetravalent (Continued)

metal element oxide/(the amount of the tetravalent metal element oxide+the amount of indium oxide)}×100(%).

12 Claims, 2 Drawing Sheets

(51) Int. Cl.
*C23C 14/08* (2006.01)
*C23C 14/58* (2006.01)
*G06F 3/044* (2006.01)
*G06F 3/045* (2006.01)

(52) U.S. Cl.
CPC .............. *G06F 3/044* (2013.01); *G06F 3/045* (2013.01); *G06F 2203/04103* (2013.01); *Y10T 428/2495* (2015.01); *Y10T 428/24975* (2015.01); *Y10T 428/25* (2015.01); *Y10T 428/26* (2015.01)

(56) References Cited

U.S. PATENT DOCUMENTS

| | | | |
|---|---|---|---|
| 6,534,183 | B1 | 3/2003 | Inoue |
| 6,689,477 | B2 | 2/2004 | Inoue |
| 6,743,488 | B2 | 6/2004 | Memarian et al. |
| 6,982,432 | B2 | 1/2006 | Umemoto et al. |
| 8,580,088 | B2 * | 11/2013 | Haishi et al. ............ 204/192.29 |
| 2003/0035906 | A1 | 2/2003 | Memarian et al. |
| 2003/0148871 | A1 | 8/2003 | Inoue |
| 2006/0285213 | A1 * | 12/2006 | Kanda et al. ................. 359/619 |
| 2008/0152879 | A1 | 6/2008 | Nashiki et al. |
| 2008/0261030 | A1 | 10/2008 | Nashiki et al. |
| 2009/0104440 | A1 | 4/2009 | Nashiki et al. |
| 2010/0143634 | A1 | 6/2010 | Yasui et al. |
| 2012/0012370 | A1 | 1/2012 | Nashiki et al. |

FOREIGN PATENT DOCUMENTS

| | | | |
|---|---|---|---|
| JP | 1-227307 | A | 9/1989 |
| JP | 08043841 | A * | 2/1996 |
| JP | 10-34797 | A | 2/1998 |
| JP | 2008-146927 | A | 6/2008 |

OTHER PUBLICATIONS

Chinese Office Action dated Jul. 15, 2014, issued in correponding CN application No. 201310255891.0 with English translation (24 pages).
Office Action dated Mar. 23, 2015, issued in corresponding Chinese application No. 201310255891.0, w/ English translation (16 pages).
Chinese Office Action dated Nov. 3, 2015 issued in counterpart Chinese Patent Application No. 201310255891.0, with English translation. (18 pages).
Chinese Office Action dated Dec. 16, 2015 issued in counterpart Chinese Patent Application No. 201310506879.2, with English translation. (20 pages).
Office Action dated Jul. 3, 2015, issued in counterpart Chinese application No. 201310506879.2, with English translation.
Notice of Allowance dated Jul. 25, 2016, issued in U.S. Appl. No. 14/052,398 (7 pages).

* cited by examiner

METHOD FOR PRODUCTION OF TRANSPARENT CONDUCTIVE FILM

CROSS-REFERENCE TO RELATED APPLICATIONS

This application is a divisional of U.S. application Ser. No. 13/280,806 filed Oct. 25, 2011.

BACKGROUND OF THE INVENTION

Field of the Invention

The invention relates to a transparent conductive film having transparency in the visible light region and including a film substrate and a transparent conductive laminate that is provided on the film substrate and includes at least two transparent conductive layers. The invention also relates to a touch panel having such a transparent conductive film. The transparent conductive film of the invention is used for transparent electrodes in touch panels or displays such as liquid crystal displays and electroluminescence displays and also used for electromagnetic wave shielding or prevention of static buildup on transparent products. According to position detection method, touch panels may be classified into optical, ultrasonic, capacitance, and resistive touch panels. The transparent conductive film of the invention is suitable for use in capacitance touch panels, specifically, projection-type capacitance touch panels.

Description of the Related Art

Concerning a conventional transparent conductive film, the so-called conductive glass is well known, which includes a glass substrate and a transparent conductive layer of indium oxide formed thereon. Unfortunately, it has low flexibility or workability and cannot be used in some applications because the substrate is made of glass.

In recent years, therefore, various plastic films including polyethylene terephthalate films have been used to form substrates because of their advantages such as good impact resistance and light weight as well as flexibility and workability, and there has been used a transparent conductive film including a transparent conductive layer of indium oxide formed on such substrates.

Such a transparent conductive layer is often crystallized to meet requirements such as low resistance, high transmittance, and high durability. The crystallization method generally includes forming an amorphous transparent conductive layer on a film substrate and then crystallizing the amorphous transparent conductive layer by heating or any other method. Unfortunately, when such a transparent conductive film is produced, it is generally difficult to heat the film substrate to 200° C. or higher during the crystallization, depending on the heat resistance of the film substrate. Thus, there is a problem in which the time required to crystallize the transparent conductive layer is longer in the case where the transparent conductive film is produced with a film substrate than in the case where the transparent conductive layer is formed on a glass substrate and crystallized by heating at high temperature.

To solve the crystallization time problem and to satisfy reliability at high temperature and high humidity, it is proposed that transparent conductive layers having a two-layer structure should be formed on a film substrate. For example, it is proposed that a thin film of an indium-tin complex oxide with a low tin oxide content should be formed on the film substrate side and another thin film of an indium-tin complex oxide with a high tin oxide content should be formed thereon (JP-A 2006-244771).

SUMMARY OF THE INVENTION

According to JP-A 2006-244771, the crystallization time is reduced to some extent as compared with the case where a single transparent conductive layer is formed. However, there has been a demand for a further reduction in the time for the crystallization of transparent conductive layers.

As mentioned above, transparent conductive films are used as transparent electrodes for touch panels or displays. Projection-type capacitance touch panels have rapidly spread because they enable multi-touch input or gesture input and can be installed in smartphones. Such projection-type capacitance touch panels have a structure in which a pair of transparent conductive films each having a patterned transparent conductive layer are opposed to each other, and in which the capacitance between the upper and lower transparent conductive layers (or voltage amplitude, frequency, or the like) is measured while a current is allowed to flow through the transparent conductive films. When an object such as a finger is put closer to the upper-side transparent conductive film of a projection-type capacitance touch panel, the capacitance between the upper and lower transparent conductive layers changes, so that the part to which the object is put closer is detected. It has been desired that a projection-type capacitance touch panel should be produced using transparent conductive layers with a low resistance (for example, a surface resistance of about 150 Ω/square) so that the sensitivity and resolution of the sensor can be improved. Specifically, it has been desired that the specific resistance should be lowered. Unfortunately, a transparent conductive film produced with a film substrate has a problem in which the upper limit of the heating temperature for the crystallization of the transparent conductive layer is lower than that in the case where a glass substrate is used, and therefore, the specific resistance of the crystallized transparent conductive layer is higher in the transparent conductive film than in the product having the glass substrate. JP-A 2006-244771 discloses that reliability at high temperature and high humidity can be improved in addition to a reduction in crystallization time, but the specific resistance of transparent conductive layers cannot be reduced according to JP-A 2006-244771.

An object of the invention is to provide a transparent conductive film that allows a reduction in crystallization time and has crystalline transparent conductive layers.

Another object of the invention is to provide a transparent conductive film that allows a reduction in crystallization time and a reduction in specific resistance and has crystalline transparent conductive layers.

A further object of the invention is to provide a touch panel produced using such a transparent conductive film.

To solve the conventional problems, the inventors have accomplished the invention based on the finding that the objects can be achieved by the transparent conductive film and other features described below.

The invention relates to a transparent conductive film, including:
 a transparent film substrate; and
 a transparent conductive laminate that is provided on at least one surface of the transparent film substrate and includes a first transparent conductive layer and a second transparent conductive layer, wherein the first transparent conductive layer is a first crystalline layer comprising indium oxide or an indium-based complex oxide having a tetravalent metal element oxide, a first content of the tetravalent metal element oxide of the first transparent conductive layer is more than 0% by weight and not more than 6% by weight, the second transparent conductive layer is a second crystalline layer comprising an indium-based complex oxide having a tetravalent metal element oxide, and located between the transparent film substrate and the first transparent conductive layer, and a second content of the tetravalent metal element oxide of the second transparent conductive layer is higher than the first content, wherein each of the first and the second contents of the tetravalent metal element oxide content is expressed by the formula: {the amount of the tetravalent metal element oxide/(the amount of the tetravalent metal element oxide+the amount of indium oxide)}×100(%).

In the transparent conductive film, it is preferable that there is a difference between the first content and the second content is preferably 3% by weight or more.

In the transparent conductive film, the second content is preferably 3 to 35% by weight.

In the transparent conductive film, a first thickness of the first transparent conductive layer is preferably smaller than a second thickness of the second transparent conductive layer. A difference between the first thickness and the second thickness is preferably 1 nm or more.

In the transparent conductive film, the first thickness is preferably 1 to 17 nm, and the second thickness is preferably 9 to 34 nm.

The transparent conductive films further may include a third transparent conductive layer that is located between the transparent film substrate and the second transparent conductive layer, and the third transparent conductive layer is a third crystalline layer. The third transparent conductive layer is suitable for use indium oxide or an indium-based complex oxide having a tetravalent metal element oxide, and a third content of the tetravalent metal element oxide of the third transparent conductive layer is more than 0% by weight and not more than 6% by weight, wherein the third content is expressed by the formula: {the amount of the tetravalent metal element oxide/(the amount of the tetravalent metal element oxide+the amount of indium oxide)}×100(%).

In the transparent conductive film, a total thickness of the transparent conductive laminate is preferably 35 nm or less.

In the transparent conductive film, a ratio of the first thickness to the total thickness is preferably from 1 to 45%.

In the transparent conductive film, an indium-tin complex oxide may be used as the indium-based complex oxide, and tin oxide may be used as the tetravalent metal element oxide.

In the transparent conductive film, the transparent conductive laminate may be provided on the film substrate with an undercoat layer interposed therebetween.

The invention also relates to a method for producing the transparent conductive film, including:

heat-treating a transparent conductive film including a transparent film substrate and a transparent conductive laminate that is provided on at least one surface of the transparent film substrate and includes a first transparent conductive layer and a second transparent conductive layer, so that the first and the second transparent conductive layers in the transparent conductive film are crystallized, wherein the first transparent conductive layer is a first amorphous layer including indium oxide or an indium-based complex oxide having a tetravalent metal element oxide, a first content of the tetravalent metal element oxide of the first transparent conductive layer is more than 0% by weight and not more than 6% by weight, the second transparent conductive layer is a second amorphous layer including an indium-based complex oxide having a tetravalent metal element oxide, and located between the transparent film substrate and the first transparent conductive layer, and a second content of the tetravalent metal element oxide of the second transparent conductive layer is higher than the first content, wherein each of the first and the second contents of the tetravalent metal element oxide content is expressed by the formula: {the amount of the tetravalent metal element oxide/(the amount of the tetravalent metal element oxide+the amount of indium oxide)}×100(%).

The invention also relates to a touch panel, including the transparent conductive.

Conventional transparent conductive layers having a two-layer structure as disclosed in JP-A 2006-244771 include: a thin film of an indium-tin complex oxide that is provided on the film substrate side and has a low tin oxide content; and a thin film of an indium-tin complex oxide that is next to the above thin film and has a high tin oxide content. Crystallization time can be reduced to some extent using the transparent conductive layers with such a two-layer structure, as compared with using a single transparent conductive layer. Contrary to the conventional structure, the transparent conductive laminate according to the invention includes: a thin film of indium oxide or an indium-based complex oxide (such as an indium-tin complex oxide) having a low content of a tetravalent metal element oxide (such as tin oxide), which is provided on the front surface side; and a thin film of an indium-based complex oxide having a high content of the tetravalent metal element oxide, which is provided next to the above thin film. Such a structure makes crystallization time shorter than that for the conventional two-layer structure.

An indium-based complex oxide is generally used for transparent conductive layers. This is because of taking advantage of the fact that doping indium oxide with a tetravalent metal element oxide causes substitution between the trivalent indium and the tetravalent metal element in the process of forming indium oxide crystals by heating or the like, so that excess electrons serve as carriers in the resulting crystalline layer. Therefore, as the content of the tetravalent metal element oxide in the indium-based complex oxide increases, current carriers increase, so that the specific resistance decreases.

On the other hand, as the content of the tetravalent metal element oxide increases, impurities capable of inhibiting the crystallization of indium oxide increase. At the same heating temperature, therefore, as the content of the tetravalent metal element oxide increases, the time required for the crystallization increases. It is also considered that if crystal nuclei can be formed with lower energy, the time required for the crystallization of indium oxide can be reduced. Therefore, it is considered that generating necessary energy for the formation of crystal nuclei is rate-limiting in the crystallization.

It is also considered that gas can be generated from the film substrate to affect the indium oxide thin film formed on the film substrate, and therefore, the thin film formed at a position more apart from the film substrate (toward the uppermost surface side) can be less defective and more susceptible to crystallization.

From the foregoing, it is considered that when the process of forming plural transparent conductive layers includes forming an indium-based complex oxide thin film having a high tetravalent metal element oxide content and then forming thereon an indium oxide thin film or an indium-based complex oxide thin film having a low tetravalent metal element oxide content, the thin film located on the front surface side has a low content of impurities including the tetravalent metal element and therefore is susceptible to crystallization, so that the use of such a structure can reduce the time required to crystallize the amorphous transparent conductive layers.

It is considered that the effect of the invention to reduce crystallization time is produced by the feature that in the transparent conductive film including plural transparent conductive layers, a transparent conductive layer susceptible to crystallization is placed at a position susceptible to crystallization so that crystal growth in an amorphous transparent conductive layer less susceptible to crystallization can be facilitated.

As mentioned above, as the content of a tetravalent metal element oxide in an indium oxide material for a transparent conductive layer increases, current carriers increase, so that specific resistance decreases. Therefore, it has been considered that a reduction in specific resistance and a reduction in the content of a tetravalent metal element content for the purpose of reducing crystallization time are a trade-off or difficult to achieve at the same time. According to the invention, however, a reduction in crystallization time and a reduction in specific resistance can be achieved at the same time. In the transparent conductive film of the invention, the front surface side transparent conductive layer of the plural transparent conductive layers is produced using indium oxide or an indium-based complex oxide having a low tetravalent metal element oxide content. It is therefore considered that since the front surface side transparent conductive layer contains no tetravalent metal element oxide or has a low tetravalent metal element oxide content, the rate of substitution of the tetravalent metal element is rather increased by the acceleration of crystallization, so that the specific resistance can be reduced.

DETAILED DESCRIPTION OF THE PREFERRED EMBODIMENTS

Embodiments of the invention are described below with reference to the drawings. It should be noted that some parts unnecessary for explanation are omitted, and some parts are illustrated in an enlarged, reduced or modified form for easy understanding.

Figure 1:
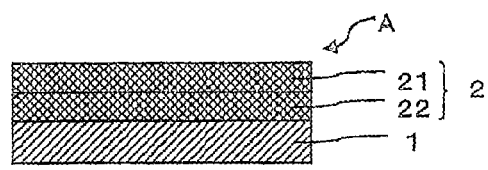
FIG. 1 is a schematic cross-sectional view showing a transparent conductive film according to an embodiment of the invention.
Figure 2:
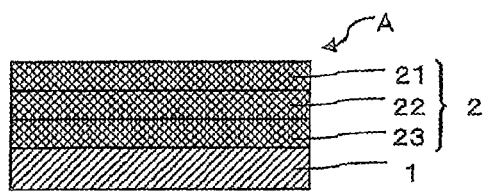
FIG. 2 is a schematic cross-sectional view showing a transparent conductive film according to an embodiment of the invention.
Figure 3:
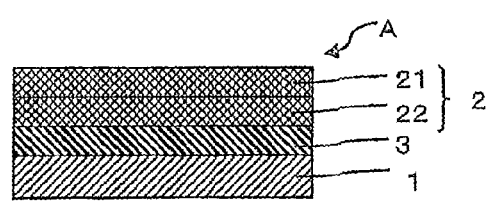
FIG. 3 is a schematic cross-sectional view showing a transparent conductive film according to an embodiment of the invention.

FIGS. 1 to 3 are each a schematic cross-sectional view showing an example of the transparent conductive film (A) according to an embodiment of the invention. Every one of the transparent conductive films (A) includes a transparent film substrate (1) and a transparent conductive laminate (2) that includes at least two transparent conductive layers and is formed on one surface of the transparent film substrate (1). All of the transparent conductive layers include indium oxide or an indium-based complex oxide having a tetravalent metal element oxide. The transparent conductive laminate (2), which includes at least two transparent conductive layers, may include three or more transparent conductive layers. While FIGS. 1 to 3 each show that the transparent conductive laminate (2) is provided on only one surface of the transparent film substrate (1), a transparent conductive layer may also be provided on the other surface of the film substrate (1). A single or two or more transparent conductive layers may also be provided on the other surface, and such two or more transparent conductive layers may form the same structure as those of the transparent conductive laminate (2).

FIG. 1 shows a case where in the transparent conductive film (A), the transparent conductive laminate (2) has two transparent conductive layers, and the transparent conductive laminate (2) includes: a first transparent conductive layer (21) that is located first from its uppermost surface and made of indium oxide or an indium-based complex oxide having a tetravalent metal element oxide content of more than 0% by weight and not more than 6% by weight, wherein the tetravalent metal element oxide content is expressed by the formula: {the amount of the tetravalent metal element oxide/(the amount of the tetravalent metal element oxide+the amount of indium oxide)}×100(%); and a second transparent conductive layer (22) that is located second from the uppermost surface and made of an indium-based complex oxide having a tetravalent metal element oxide content higher than that of the first transparent conductive film (21).

FIG. 2 shows a case where in the transparent conductive film (A), the transparent conductive laminate (2) includes three transparent conductive layers, and the transparent conductive laminate (2) includes a first transparent conductive layer (21) located first from its uppermost surface, a second transparent conductive layer (22) located second from its uppermost surface, and a third transparent conductive layer (23) located third from its uppermost surface. The case in FIG. 2 has one additional layer, which is the third transparent conductive layer (23), as compared with the case in FIG. 1. The third transparent conductive layer (23) is located first from the transparent film substrate (1).

FIG. 3 shows a case where the transparent conductive laminate (2) as shown in FIG. 1 is provided on the film substrate (1) with an undercoat layer (3) interposed therebetween. In the mode shown in FIG. 2, an undercoat layer (3) may also be provided as shown in FIG. 3.

Figure 4:
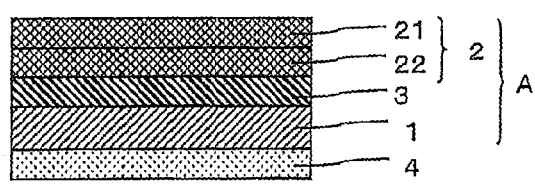
FIG. 4 is a schematic cross-sectional view showing a transparent conductive film according to an embodiment of the invention.

FIG. 4 shows a case where the transparent conductive film (A) as shown in FIG. 1 is configured to have the transparent conductive laminate (2) placed on one surface of the film substrate (1) and to have a transparent pressure-sensitive adhesive layer (4) placed on the other surface. While FIG. 4 shows a case where the transparent conductive film (A) shown in FIG. 1 is used to form a transparent conductive laminate, the transparent conductive film (A) shown in FIG. 2 or 3 or a combination thereof may also be used alternatively.

Figure 5:
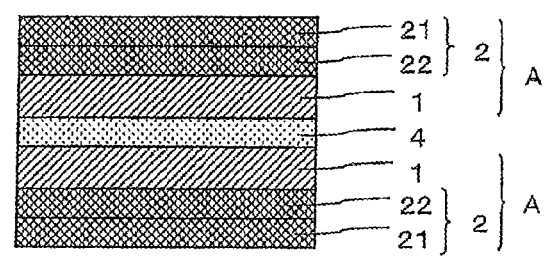
FIG. 5 is a schematic cross-sectional view showing an exemplary sensor part of a projection-type capacitance touch panel produced using a transparent conductive film according to an embodiment of the invention.
Figure 6:
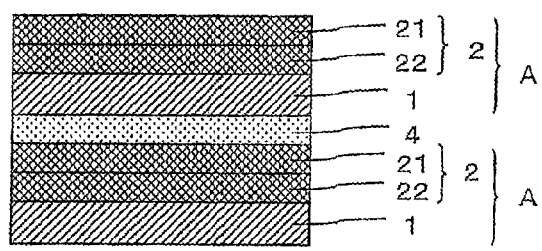
FIG. 6 is a schematic cross-sectional view showing an exemplary sensor part of a projection-type capacitance touch panel produced using a transparent conductive film according to an embodiment of the invention.

FIGS. 5 and 6 are schematic cross-sectional views each showing an exemplary sensor part of a projection-type capacitance touch panel formed using the transparent conductive film (A). While FIGS. 5 and 6 each illustrate a case where the transparent conductive film (A) shown in FIG. 1 is used, the transparent conductive film (A) of FIG. 2 or 3 or a combination thereof may also be used alternatively. FIGS. 5 and 6 each shows a structure in which the transparent conductive films (A) shown in FIG. 1 are opposed to each other with a pressure-sensitive adhesive layer (4) interposed therebetween. In FIG. 5, the film substrates (1) of the transparent conductive films (A) are bonded together with the pressure-sensitive adhesive layer (4) interposed therebetween. In FIG. 6, the film substrate (1) of one of the transparent conductive films (A) is bonded to the other transparent conductive film (A) with the transparent conductive laminate (2) interposed therebetween. In FIGS. 5 and 6, the transparent conductive laminate (2) (the transparent conductive layers (21) and (22)) has undergone a patterning process. In FIGS. 5 and 6, the transparent conductive film (A) may be placed to face any one of the upper and lower directions. The sensor part of the touch panel shown in FIG. 6 or 7 functions as a transparent switch substrate in which when an object such as a finger is brought close to the transparent conductive laminate (2), the on state is produced as a result of the measurement of an electric signal change caused by changes in the capacitance values on the upper and lower sides, and when the object such as the finger is taken away, the original off state is recovered.

Figure 7:
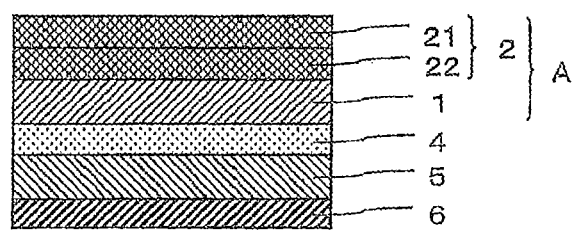
FIG. 7 is a schematic cross-sectional view showing a laminate produced using a transparent conductive film according to an embodiment of the invention.

FIG. 7 shows a case where a single layer of a transparent substrate film (5) is placed on the pressure-sensitive adhesive layer (4), which is provided on the transparent conductive film (A) as shown in FIG. 4. Alternatively, two or more layers of transparent substrate films (5) may be placed through the pressure-sensitive adhesive layer (4). In the case shown in FIG. 7, a hard coat layer (resin layer) (6) is also provided on the outer surface of the substrate film (5). While FIG. 7 shows a case where the transparent conductive film (A) shown in FIG. 1 is used to form a transparent conductive laminate, the transparent conductive film (A) of FIG. 2 or 3 or a combination thereof may be used alternatively. The laminate having the transparent conductive film (A) of FIG. 7, which is generally used to form a resistive touch panel, may also be used to form a sensor part of a projection-type capacitance touch panel as shown in FIG. 5 or 6.

Figure 8:
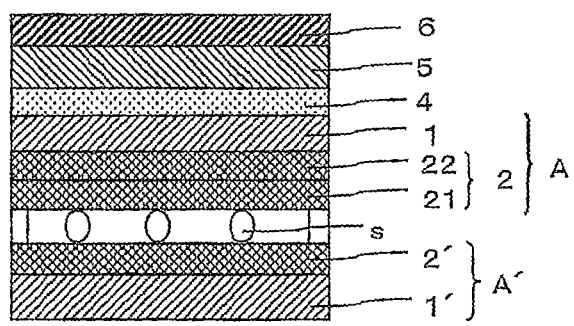
FIG. 8 is a schematic cross-sectional view showing an exemplary resistive touch panel produced using a transparent conductive film according to an embodiment of the invention.

FIG. 8 is a schematic cross-sectional view schematically showing a resistive tough panel. As shown in the drawing, the tough panel has a structure including the transparent conductive film (A) and a lower side substrate (A') that are opposed to each other with spacers (s) interposed therebetween.

The lower side substrate (A') includes another transparent substrate (1') and a transparent conductive layer (2') placed thereon. It will be understood that the invention is not limited to this mode and, for example, the transparent conductive film (A) may also be used to form the lower side substrate (A'). The material used to form another transparent substrate (1') may be basically a glass plate or the same material as used to form the substrate film (5). The thickness and other features of the substrate (1') may also be the same as those of the substrate film (5). The material used to form another transparent conductive layer (2') may be basically any of various transparent conductive layers, and another transparent conductive layer (2') may form the same structure as the transparent conductive laminate (2).

The spacers (s) may be of any insulating type, and various known conventional spacers may be used. There is no particular limitation to the method for production of the spacers (s), or the size, position, or number of the spacers (s). The spacers (s) to be used may have any known conventional shape such as a substantially spherical shape or a polygonal shape.

The touch panel shown in FIG. 8 functions as a transparent switch substrate in which contact between the transparent conductive laminate (2) and the transparent conductive layer (2') upon tapping with an input pen or the like on the transparent conductive film (A) side against the elastic force of the spacers (s) produces the electrically on state, while removal of the press turns it to the original off state.

The film substrate (1) to be used may be any of various transparent plastic films with no particular limitation. Examples of materials for such films include polyester resins, acetate resins, polyether sulfone resins, polycarbonate resins, polyamide resins, polyimide resins, polyolefin resins, (meth)acrylic resins, polyvinyl chloride resins, polyvinylidene chloride resins, polystyrene resins, polyvinyl alcohol resins, polyarylate resins, and polyphenylene sulfide resins. In particular, polyester resins, polycarbonate resins, and polyolefin resins are preferred.

The thickness of the film substrate (1) is preferably in the range of 2 to 200 μm, more preferably in the range of 2 to 120 μm, even more preferably in the range of 2 to 100 μm. If the thickness of the film substrate (1) is less than 2 μm, the film substrate (1) may have insufficient mechanical strength so that it may be difficult to perform a process of continuously forming the transparent conductive laminate (2) and other layers such as the undercoat layer (3) and the pressure-sensitive adhesive layer (4) using a roll of the film substrate (1).

The surface of the film substrate (1) may be previously subjected to sputtering, corona discharge treatment, flame treatment, ultraviolet irradiation, electron beam irradiation, chemical treatment, oxidation, or any other etching or undercoating treatment so that the transparent conductive laminate (2) or the undercoat layer (3) to be provided thereon can have improved adhesion to the film substrate (1). If necessary, the film substrate may also be subjected to dust removing or cleaning by solvent cleaning, ultrasonic cleaning, or the like, before the transparent conductive laminate (2) or the undercoat layer (3) is formed thereon.

The surface of the film substrate (1), on which the transparent conductive laminate (2) will be formed, preferably has an arithmetic average roughness (Ra) of 1.0 nm or less, more preferably 0.7 nm or less, even more preferably 0.6 nm or less, in particular, preferably 0.5 nm or less. When the surface roughness of the film substrate (1) is reduced, the transparent conductive laminate (2) can be crystallized by heating for a relatively short period of time, and after the crystallization, the transparent conductive laminate (2) can have low resistance. The lower limit of the arithmetic average surface roughness (Ra) of the transparent substrate is preferably, but not limited to, 0.1 nm or more, more preferably 0.2 nm or more, from the standpoint of imparting, to the substrate, the ability to be wound into a roll. The arithmetic average roughness Ra may be measured using an atomic force microscope (AFM) (NanoScope IV manufactured by Digital Instruments).

In general, films made of organic polymer formed products contain a filler or other materials for productivity or handleability and therefore often have an arithmetic average surface roughness Ra of several nm or more. To set the surface roughness of the film substrate (1) in the above range, the undercoat layer (3) is preferably formed on the surface of the film substrate (1), on which the transparent conductive laminate (2) will be formed. When the undercoat layer (3) is formed on the surface of the film substrate (1), the irregularities of the surface of the film substrate (1) are reduced so that the surface roughness can be reduced.

It is relatively difficult to crystallize transparent conductive layers of indium-based complex oxides having a high content of a tetravalent metal element oxide. However, when the film substrate (1) used has a specific surface roughness as described above, even an amorphous second transparent conductive layer (22) formed using indium oxide or a material with a high content of a tetravalent metal element oxide can be completely crystallized by a heat treatment for a relatively short period of time.

The undercoat layer (3) shown in FIG. 3 may be formed using an inorganic material, an organic material, or a mixture of inorganic and organic materials. Examples of inorganic materials that are preferably used include SiOx (x=1 to 2), $MgF_2$, and $Al_2O_3$. Examples of organic materials include acrylic resins, urethane resins, melamine resins, alkyd resins, siloxane polymers, and other organic substances. In particular, the organic material is preferably a thermosetting resin including a mixture of a melamine resin, an alkyd resin, and an organosilane condensate.

Using any of the above materials, the undercoat layer (3) may be formed by a dry process such as vacuum deposition, sputtering, or ion plating or a wet process (coating process). The undercoat layer (3) may be a single layer or a laminate of two or more layers. In general, the thickness of the undercoat layer (3) (the thickness of each layer in the case of a laminate of plural layers) is preferably from about 1 to about 300 nm.

The transparent conductive laminate (2), which includes at least two transparent conductive layers, is formed by a known thin film forming method such as vacuum deposition, sputtering, or ion plating, using indium oxide or an indium-based complex oxide. While materials for use in forming such thin films are selected as appropriate depending on the thin film forming method, in general, sintered materials of indium oxide and a tetravalent metal element oxide are preferably used. In such a thin film forming method as reactive sputtering, thin films may also be formed using indium metal and tin metal, while both metals are oxidized.

Examples of the tetravalent metal element include tin, cerium, hafnium, zirconium, and titanium. Oxides of these tetravalent metal elements include tin oxide, cerium oxide, hafnium oxide, zirconium oxide, and titanium oxide. Tin is preferably used as the tetravalent metal element. The tetravalent metal element oxide is preferably tin oxide, and the indium-based complex oxide is preferably an indium-tin complex oxide.

Sputtering methods that may be used to form the transparent conductive laminate (2) include not only standard magnetron sputtering methods using a DC power source but also various sputtering methods such as RF sputtering, RF and DC sputtering, pulsed sputtering, and dual magnetron sputtering methods.

Such transparent conductive layers are stacked to form the transparent conductive laminate (2). In the formation, the ratio between indium oxide and the tetravalent metal element oxide (or the ratio between indium metal and tetravalent metal), which are materials for forming the thin films, is selected, and the first transparent conductive layer (21) of indium oxide or an indium-based complex oxide having a tetravalent metal element oxide content of more than 0% by weight and not more than 6% by weight and the second transparent conductive layer (22) of an indium-based complex oxide having a tetravalent metal element oxide content higher than that of the first transparent conductive layer (21), wherein the tetravalent metal element oxide content is expressed by the formula: {the amount of the tetravalent metal element oxide/(the amount of the tetravalent metal element oxide+the amount of indium oxide)}×100(%), are formed in such a manner that the first and second transparent conductive layers (21) and (22) are placed in this order from the front surface side of the transparent conductive laminate (2) formed and that indium oxide or an indium-based complex oxide with a lower content of the tetravalent metal element oxide is formed on the front surface side.

The first transparent conductive layer (21) is preferably made of indium oxide or an indium-based complex oxide having a tetravalent metal element oxide content of more than 0% by weight and not more than 5% by weight. The content of the tetravalent metal element oxide in the first transparent conductive layer (21) on the front surface side is preferably as specified above so that its crystallization can be accelerated by a heat treatment at a low temperature for a short period of time. If the content of the tetravalent metal element oxide in the first transparent conductive layer (21) is more than 6% by weight, the heat treatment process for its crystallization will be time-consuming.

The content of the tetravalent metal element oxide in the second transparent conductive layer (22) is set higher than the content of the tetravalent metal element oxide in the first transparent conductive layer (21). The difference between the tetravalent metal element oxide contents of the second transparent conductive layer (22) and the first transparent conductive layer (21) is preferably 3% by weight or more from the standpoint of reducing the specific resistance and the crystallization time. The difference between the tetravalent metal element oxide contents is more preferably from 3 to 35% by weight, even more preferably from 3 to 25% by weight, still more preferably from 5 to 25% by weight. In general, the tetravalent metal element oxide content of the second transparent conductive layer (22) is preferably from 3 to 35% by weight, more preferably from 3 to 25% by weight, even more preferably 5 to 25% by weight, still more preferably from 7 to 25% by weight, yet more preferably from 8 to 25% by weight.

From the standpoint of keeping the flexibility of the transparent conductive film high, the thickness of the first transparent conductive layer (21) may be from 1 to 17 nm, preferably from 1 to 12 nm, more preferably from 1 to 6 nm. The thickness of the second transparent conductive layer (22) is generally from 9 to 34 nm, preferably from 9 to 29 nm, more preferably from 9 to 24 nm.

While the first and second transparent conductive layers (21) and (22) may each have a thickness in the above range, for a reduction in specific resistance, the first and second transparent conductive layers (21) and (22) are preferably formed so that the first transparent conductive layer (21) has a thickness smaller than that of the second transparent conductive layer (22). From the standpoint of reducing specific resistance, such a difference between the thicknesses of the first and second transparent conductive layers (21) and (22) is preferably 1 nm or more, more preferably from 1 to 33 nm, even more preferably from 1 to 20 nm.

The third transparent conductive layer (23) shown in FIG. 2 is provided independently of the first and second transparent conductive layers (21) and (22). The third transparent conductive layer (23) may be made of indium oxide or an indium-based complex oxide. The content of a tetravalent metal element oxide in the third transparent conductive layer (23) is not restricted and may be selected from the range of more than 0% by weight and not more than 35% by weight. From the standpoint of reducing the crystallization time, the content of the tetravalent metal element oxide is preferably more than 0% by weight and not more than 6% by weight, more preferably more than 0% by weight and not more than 5% by weight similarly to the first transparent conductive layer (21). The thickness of the third transparent conductive layer (23) is generally from 1 to 17 nm, preferably from 1 to 12 nm, more preferably from 1 to 6 nm. While FIG. 2 shows that a single layer of the third transparent conductive layer (23) is provided on the film substrate (1) side, two or more layers of the third transparent conductive layers may be formed independently of the first and second transparent conductive layers (21) and (22).

As described above, the first transparent conductive layer (21) is preferably provided in the uppermost part of the transparent conductive laminate (2). On the other hand, any layer (not shown) that does not affect the invention may also be provided on the front surface side of the first transparent conductive layer (21).

The transparent conductive laminate (2), which includes the first and second transparent conductive layers (21) and (22) as described above, preferably has a total thickness of 35 nm or less, more preferably 30 nm or less, so that it can have a high transmittance.

In order to reduce the specific resistance, the transparent conductive laminate (2) is preferably designed so that the ratio of the thickness of the first transparent conductive layer (21) to the total thickness of the transparent conductive laminate (2) is from 1 to 45%. The ratio of the thickness of the first transparent conductive layer (21) is preferably from 1 to 30%, more preferably from 1 to 20%.

The sputtering target for use in the sputtering film formation is selected from indium oxide or an indium-based complex oxide, depending on each thin film for the transparent conductive laminate (2). In addition, the content of the tetravalent metal element oxide in the indium-based complex oxide is controlled. The sputtering film formation using such a target is performed in a sputtering system, which is evacuated to high vacuum and into which argon gas, an inert gas, is introduced. When the sputtering target used is a metal target made of indium or indium-tetravalent metal (for example, indium-tin), reactive sputtering film formation should be performed with argon gas introduced together with an oxidizing agent such as oxygen gas. Even when an oxide target such as indium oxide or an indium-based complex oxide is used, argon gas may also be introduced together with oxygen gas or the like.

Water molecules present in the film formation atmosphere may terminate dangling bonds, which are produced during the film formation, so that the crystal growth of indium oxide or an indium-based complex oxide may be hindered. Therefore, the partial pressure of water in the film formation atmosphere is preferably low. During the film formation, the water partial pressure is preferably 0.1% or less, more preferably 0.07% or less, based on the partial pressure of argon gas. During the film formation, the water partial pressure is also preferably $2 \times 10^{-4}$ Pa or less, more preferably $1.5 \times 10^{-4}$ Pa or less, even more preferably $1 \times 10^{-4}$ Pa or less. In order for the water partial pressure during the film formation to be in the above range, the sputtering system before the start of the film formation is preferably evacuated until the water partial pressure reaches $2 \times 10^{-4}$ Pa or less, preferably $1.5 \times 10^{-4}$ Pa or less, more preferably $1 \times 10^{-4}$ Pa or less so as to fall within the above range so that impurities such as water and organic gas produced from the substrate can be removed from the atmosphere in the system.

During the sputtering film formation, the substrate temperature is preferably higher than 100° C. When the substrate temperature is set higher than 100° C., the crystallization of the indium-based complex oxide film (even with a high tetravalent metal atom content) can be easily accelerated in the heat treatment process described below, and a low-resistance, crystalline, transparent conductive laminate (2) can be obtained. Therefore, in order to form a low-resistance, crystalline, transparent conductive laminate (2) in the process of crystallizing an amorphous transparent conductive laminate (2) by heating, the substrate temperature is preferably 120° C. or more, more preferably 130° C. or more, in particular, preferably 140° C. or more. In order to suppress thermal damage to the substrate, the substrate temperature is preferably 200° C. or less, more preferably 180° C. or less, even more preferably 170° C. or less, in particular, preferably 160° C. or less.

As used herein, the term "substrate temperature" refers to the set temperature of a base on which the substrate is placed during the sputtering film formation. For example, when the sputtering film formation is continuously performed in a roll-to-roll sputtering system, the substrate temperature corresponds to the temperature of a can roll on which the sputtering film formation is performed. When the sputtering film formation is performed by a piece-by-piece method (batch method), the substrate temperature corresponds to the temperature of a substrate holder for holding the substrate.

The transparent conductive film of the invention includes the transparent conductive laminate (2) including: the first transparent conductive layer (21) of indium oxide or an indium-based complex oxide with a specific content of a tetravalent metal element oxide; and the second transparent conductive layer (22) of an indium-based complex oxide in which the content of the tetravalent metal element oxide is higher than that in the first transparent conductive layer (21), which are placed in this order from the front surface side of the transparent conductive laminate (2), wherein the transparent conductive laminate (2) is a crystalline layer. The crystalline transparent conductive laminate (2) can be formed by a process including sequentially forming amorphous transparent conductive layers and then performing an appropriate heat treatment to crystallize the amorphous transparent conductive laminate (2) so that a crystalline layer can be formed. The heat treatment may be performed using heating means such as an infrared heater or a hot-air circulation oven according to known methods. In such a process, the heat treatment temperature should be 150° C. or less, which is acceptable to the film substrate. In an embodiment of the invention, a heat treatment at such a low temperature for a short period of time can achieve sufficient crystallization. Specifically, a heat treatment at 150° C. for a time period of 2 hours or less enables the formation of a high-quality crystalline layer.

In the heat treatment process, the heating temperature is preferably from 120° C. to 150° C., more preferably from 125° C. to 150° C., even more preferably from 130° C. to 150° C. The sufficient heating time can be reduced to less than 60 minutes and further reduced to 45 minutes or less, so that the crystallization time can be reduced. When the heating temperature and the heating time are appropriately selected, the film can be completely crystallized with no reduction in productivity or quality. In order to crystallize the amorphous transparent conductive laminate (2) completely, the heating is preferably performed for a time period of 30 minutes or more.

When the transparent conductive film is used to form a projection-type capacitance touch panel, a matrix-type resistive touch panel, or any other touch panel, the transparent conductive laminate (2) is patterned into a specific shape (for example, a strip shape) in some cases. However, when crystallized by the heat treatment, the indium oxide film or the indium-based complex oxide film is less susceptible to an etching process with an acid. In contrast, the amorphous indium oxide or indium-based complex oxide film before the heat treatment can be easily processed by etching. Therefore, when the transparent conductive laminate (2) is patterned by etching, the transparent conductive laminate (2) should preferably be subjected to the etching process after the film formation before the heat treatment process.

A transparent pressure-sensitive adhesive layer (4) may be provided on the other surface of the film substrate (1). The transparent pressure-sensitive adhesive layer (4) may be of any type having transparency. Specific examples include transparent pressure-sensitive adhesive layers including, as a base polymer, an acryl-based polymer, a silicone polymer, polyester, polyurethane, polyamide, polyvinyl ether, a vinyl acetate-vinyl chloride copolymer, modified polyolefin, an epoxy polymer, a fluoropolymer, rubber such as natural rubber or synthetic rubber, or any other polymer, which may be appropriately selected and used. In particular, an acryl-based pressure-sensitive adhesive is preferably used because it has high optical transparency and an appropriate level of adhesive properties such as wettability, cohesiveness, and tackiness.

The pressure-sensitive adhesive layer (4) has a cushion effect and thus can function to improve the scratch resistance of the transparent conductive laminate (2) formed on one side of the film substrate (1) and to improve tap properties, so-called pen input durability and contact pressure durability, for touch panels. In order to perform this function better, it is preferred that the elastic modulus of the pressure-sensitive adhesive layer (4) should be set in the range of 1 to 100 N/cm$^2$ and that its thickness should be set to 1 μm or more, generally in the range of 5 to 100 μm.

If the thickness of the pressure-sensitive adhesive layer (4) is less than 1 μm, the cushion effect can no longer be expected, so that it will tend to be difficult to improve the scratch resistance of the transparent conductive laminate (2) or pen input durability and contact pressure durability for touch panels. On the other hand, if it is too thick, it may have reduced transparency, or good results may be difficult to obtain with respect to the formation of the pressure-sensitive adhesive layer (4), the bonding workability, and the cost.

EXAMPLES

Hereinafter, the invention is described in more detail with reference to the examples, which however are not intended to limit the gist of the invention. In each example, all parts are by weight unless otherwise specified.

(Arithmetic Average Roughness)

The arithmetic average roughness was measured using an atomic force microscope (AFM) (NanoScope IV manufactured by Digital Instruments).

Example 1

A 30 nm thick undercoat layer of a thermosetting resin composed of a melamine resin, an alkyd resin, and an organosilane condensate (2:2:1 in weight ratio) was formed on one surface of a film substrate made of a 23 μm thick polyethylene terephthalate film (hereinafter referred to as PET film). The surface of the undercoat layer had an arithmetic average roughness Ra of 0.5 nm.

A 20 nm thick transparent conductive layer of an indium-tin complex oxide was formed on the undercoat layer by a reactive sputtering method using a sintered material of 90% indium oxide and 10% tin monoxide in a 0.4 Pa atmosphere composed of 80% by volume of argon gas and 20% by volume of oxygen gas. The film formation process included evacuating the sputtering system until the water partial pressure at the time of film formation reached $8.0 \times 10^{-5}$ Pa, then introducing argon gas and oxygen gas, and forming the film at a substrate temperature of 140° C. in an atmosphere with a water partial pressure of $8.0 \times 10^{-5}$ Pa. At this time, the water partial pressure was 0.05% of the partial pressure of the argon gas. The resulting transparent conductive layer corresponds to the second transparent conductive layer (22), which is located second from the uppermost surface in FIG. 1.

A 5 nm thick transparent conductive layer of an indium-tin complex oxide was formed on the resulting transparent conductive layer by a reactive sputtering method using a sintered material of indium oxide. The film formation process included evacuating the sputtering system until the water partial pressure at the time of film formation reached $8.0 \times 10^{-5}$ Pa, then introducing argon gas and oxygen gas, and forming the film at a substrate temperature of 140° C. in an atmosphere with a water partial pressure of $8.0 \times 10^{-5}$ Pa. At this time, the water partial pressure was 0.05% of the partial pressure of the argon gas. The resulting transparent conductive layer corresponds to the first transparent conductive layer (21) which is located first from the uppermost surface in FIG. 1.

In this way, a transparent conductive laminate including first and second amorphous transparent conductive layers was formed to obtain a transparent conductive film. Subsequently, the resulting transparent conductive film was heat-treated at 140° C. in a hot-air circulation oven so that the transparent conductive laminate was crystallized.

Examples 2 to 7 and 9 to 13

Transparent conductive films were prepared as in Example 1, except that the content of tin oxide in the sintered indium oxide-tin oxide material and the thickness of each layer, which were used in the formation of the first and second transparent conductive layers, were changed as shown in Table 1. Each transparent conductive laminate was also crystallized as in Example 1. In Table 1, "tin oxide content" indicates the content of tin oxide in the indium oxide or indium-tin complex oxide material used as the sputtering target. A tin oxide content of "0%" indicates the case using indium oxide. The thickness of the transparent conductive layer indicates the thickness before the crystallization. The content of tin oxide and the thickness of the transparent conductive layer are considered to be unchanged even after the crystallization.

Example 8

An undercoat layer was formed on one surface of a film substrate as in Example 1. A 3 nm thick transparent conductive layer of an indium-tin complex oxide was formed on the undercoat layer by a reactive sputtering method using a sintered material of 97% indium oxide and 3% tin monoxide in a 0.4 Pa atmosphere composed of 80% by volume of argon gas and 20% by volume of oxygen gas. The film formation process included evacuating the sputtering system until the water partial pressure at the time of film formation reached $8.0 \times 10^{-5}$ Pa, then introducing argon gas and oxygen gas, and forming the film at a substrate temperature of 140° C. in an atmosphere with a water partial pressure of $8.0 \times 10^{-5}$ Pa. At this time, the water partial pressure was 0.05% of the partial pressure of the argon gas. The resulting transparent conductive layer corresponds to the third transparent conductive layer (23) which is located third from the uppermost surface in FIG. 2.

A 19 nm thick transparent conductive layer of an indium-tin complex oxide was further formed on the resulting transparent conductive layer by a reactive sputtering method using a sintered material of 90% indium oxide and 10% tin monoxide. The film formation process included evacuating the sputtering system until the water partial pressure at the time of film formation reached $8.0 \times 10^{-5}$ Pa, then introducing argon gas and oxygen gas, and forming the film at a substrate temperature of 140° C. in an atmosphere with a water partial pressure of $8.0 \times 10^{-5}$ Pa. At this time, the water partial pressure was 0.05% of the partial pressure of the argon gas. The resulting transparent conductive layer corresponds to the second transparent conductive layer (22) which is located second from the uppermost surface in FIG. 2.

A 3 nm thick transparent conductive layer of an indium-tin complex oxide was further formed on the resulting transparent conductive layer by a reactive sputtering method using a sintered material of 97% indium oxide and 3% tin monoxide. The film formation process included evacuating the sputtering system until the water partial pressure at the time of film formation reached $8.0 \times 10^{-5}$ Pa, then introducing argon gas and oxygen gas, and forming the film at a substrate temperature of 140° C. in an atmosphere with a water partial pressure of $8.0 \times 10^{-5}$ Pa. At this time, the water partial pressure was 0.05% of the partial pressure of the argon gas. The resulting transparent conductive layer corresponds to the first transparent conductive layer (21) which is located first from the uppermost surface in FIG. 2.

In this way, a transparent conductive laminate including first, second, and third amorphous transparent conductive layers was formed to obtain a transparent conductive film. Subsequently, the resulting transparent conductive film was heat-treated at 140° C. in a hot-air circulation oven so that the transparent conductive laminate was crystallized.

Comparative Example 1

An undercoat layer was formed on one surface of a film substrate as in Example 1. A 25 nm thick amorphous transparent conductive layer of an indium-tin complex oxide was formed on the undercoat layer by a reactive sputtering method using a sintered material of 90% indium oxide and 10% tin monoxide in a 0.4 Pa atmosphere composed of 80% by volume of argon gas and 20% by volume of oxygen gas. Subsequently, the resulting transparent conductive film was heat-treated at 150° C. in a hot-air circulation oven so that the transparent conductive laminate was crystallized.

Comparative Examples 2 to 5

Amorphous transparent conductive films were prepared as in Example 1, except that the content of tin oxide in the sintered indium oxide-tin oxide material and the thickness of each layer, which were used in the formation of the first and second transparent conductive layers, were changed as shown in Table 1. Each transparent conductive laminate was also crystallized as in Example 1. The crystallization time is shown in Table 1.

(Evaluation)

The transparent conductive films obtained in the examples and the comparative examples were evaluated as described below. The results are shown in Table 1.

<Thickness of Each Layer>

The thickness of the film substrate was measured with a microgauge type thickness gauge manufactured by Mitutoyo Corporation. The thickness of each of the undercoat layer and the transparent conductive layer was calculated using an instantaneous multichannel photodetector system MCPD-2000 (trade name) manufactured by Otsuka Electronics Co., Ltd., based on the waveform data on the resulting interference spectrum.

<Crystallization Time>

In each example, the time (minutes) required to crystallize the transparent conductive layer (laminate) was measured. The heating was performed at 140° C. using a hot-air circulation oven, and whether the transparent conductive layer (laminate) was crystallized was determined by "checking the completion of the change (reduction) in resistance value" and performing an "etching test" as described below.

"Checking the completion of the change (reduction) in resistance value": While the heating was performed at 140° C. using a hot-air circulation oven, the surface resistance value was measured every 30 minutes. As the crystallization proceeds, the surface resistance value decreases, and when the crystallization is completed, the surface resistance value becomes constant. Therefore, the crystallization time was determined at the time when the surface resistance value became constant.

"Etching test": The transparent conductive laminate was immersed in hydrochloric acid with a concentration of 5% by weight for 15 minutes, and then the resistance value (Ω) between two points 15 mm apart was measured using a tester (DIGITAL TESTER (M-04) (product name) manufactured by CUSTOM, measurement limit: 2 MΩ) to determine whether or not the transparent conductive layer (laminate) was crystallized. When a certain resistance value was detected, it was determined that the transparent conductive layer (laminate) was crystallized.

<Surface Resistance>

The surface resistance (Ω/square) of the transparent conductive layer in each transparent conductive film was measured using a four-terminal method.

<Specific Resistance>

The thickness of the transparent conductive layer (laminate) was measured using an X-ray fluorescence analyzer (manufactured by Rigaku Corporation), and the specific resistance was calculated from the surface resistance and the thickness.

TABLE 1

| | Transparent conductive layer (laminate) | | | | | | Evaluation | | |
|---|---|---|---|---|---|---|---|---|---|
| | First from uppermost surface | | Second from uppermost surface | | Third from uppermost surface | | | | |
| | Tin oxide content (wt %) | Thickness (nm) | Tin oxide content (wt %) | Thickness (nm) | Tin oxide content (wt %) | Thickness (nm) | Total thickness (nm) | Crystallization time (minutes) | Surface resistance (Ω/square) | Specific resistance (Ω · cm) |
| Example 1 | 0 | 5 | 10 | 20 | — | — | 25 | 30 | 150 | $3.75 \times 10^{-4}$ |
| Example 2 | 0 | 5 | 15 | 20 | — | — | 25 | 30 | 130 | $3.25 \times 10^{-4}$ |
| Example 3 | 0 | 5 | 35 | 20 | — | — | 25 | 45 | 130 | $3.25 \times 10^{-4}$ |
| Example 4 | 3 | 5 | 10 | 20 | — | — | 25 | 30 | 130 | $3.25 \times 10^{-4}$ |
| Example 5 | 3 | 10 | 10 | 15 | — | — | 25 | 30 | 140 | $3.50 \times 10^{-4}$ |
| Example 6 | 3 | 3 | 10 | 22 | — | — | 25 | 30 | 130 | $3.25 \times 10^{-4}$ |
| Example 7 | 3 | 13 | 10 | 12 | — | — | 25 | 30 | 150 | $3.75 \times 10^{-4}$ |
| Example 8 | 3 | 3 | 10 | 19 | 3 | 3 | 25 | 30 | 130 | $3.25 \times 10^{-4}$ |
| Example 9 | 3 | 5 | 15 | 20 | — | — | 25 | 30 | 130 | $3.25 \times 10^{-4}$ |
| Example 10 | 3 | 5 | 35 | 20 | — | — | 25 | 45 | 130 | $3.25 \times 10^{-4}$ |
| Example 11 | 6 | 5 | 10 | 20 | — | — | 25 | 30 | 140 | $3.50 \times 10^{-4}$ |
| Example 12 | 6 | 5 | 15 | 20 | — | — | 25 | 30 | 130 | $3.25 \times 10^{-4}$ |
| Example 13 | 6 | 5 | 35 | 20 | — | — | 25 | 45 | 130 | $3.25 \times 10^{-4}$ |
| Comparative Example 1 | 10 | 25 | — | — | — | — | 25 | 90 | 150 | $3.75 \times 10^{-4}$ |
| Comparative Example 2 | 10 | 20 | 3 | 5 | — | — | 25 | 60 | 150 | $3.75 \times 10^{-4}$ |
| Comparative Example 3 | 8 | 5 | 10 | 20 | — | — | 25 | 90 | 140 | $3.50 \times 10^{-4}$ |
| Comparative Example 4 | 8 | 5 | 15 | 20 | — | — | 25 | 120 | 130 | $3.25 \times 10^{-4}$ |
| Comparative Example 5 | 8 | 5 | 35 | 20 | — | — | 25 | >120 | — | — |

It is apparent that the crystallization time is shorter in the examples than in the comparative examples. It is also apparent that when the thickness of the first transparent conductive layer (21) is controlled to be smaller than the thickness of the second transparent conductive layer (22) as in the examples, the surface resistance and the specific resistance can be reduced.

What is claimed is:

1. A method for producing a transparent conductive film, comprising:
heat-treating a transparent conductive film comprising a transparent film substrate and a transparent conductive laminate having a total thickness of 35 nm or less that is provided on at least one surface of the transparent film substrate and comprises a first transparent conductive layer and a second transparent conductive layer, so that the first and the second transparent conductive layers in the transparent conductive film are crystallized, wherein
the transparent film substrate is a transparent plastic film,
the thickness of the first transparent conductive layer is smaller than the thickness of the second transparent conductive layer,
a difference between the thickness of the first transparent conductive layer and the thickness of the second transparent conductive layer is 1 nm or more,
the thickness of the first transparent conductive layer is 1 to 17 nm, and the thickness of the second transparent conductive layer is 9 to 34 nm,
the first transparent conductive layer is a first amorphous layer comprising indium oxide or an indium-based complex oxide having a tetravalent metal element oxide,
a first content of the tetravalent metal element oxide of the first transparent conductive layer is more than 0% by weight and not more than 5% by weight,
the second transparent conductive layer is a second amorphous layer comprising an indium-based complex oxide having a tetravalent metal element oxide, and located between the transparent film substrate and the first transparent conductive layer, and
a second content of the tetravalent metal element oxide of the second transparent conductive layer is higher than the first content,
wherein each of the first and the second contents of the tetravalent metal element oxide content is expressed by the formula: {the amount of the tetravalent metal element oxide/(the amount of the tetravalent metal element oxide+the amount of indium oxide)}×100(%),
wherein a heating temperature in the heat-treating is from 120° C. to 150° C., and a heating time in the heat-treating is less than 60 minutes,
a first surface of the second transparent conductive layer directly contacting the substrate and the first transparent conductive layer directly contacting a second surface of the second transparent conductive layer opposite to the first surface.

2. The method according to claim 1, wherein a difference between the first content and the second content is 3% by weight or more.

3. The method according to claim 1, wherein the second content is 3 to 35% by weight.

4. The method according to claim 1, wherein a ratio of the thickness of the first transparent conductive layer to the total thickness of the transparent conductive laminate is from 1 to 45%.

5. The method according to claim 1, wherein the indium-based complex oxide is an indium-tin complex oxide, and the tetravalent metal element oxide is tin oxide.

6. The method according to claim 1, wherein the heating temperature in the heat-treating is from 125° C. to 150° C.

7. The method according to claim 1, wherein the transparent plastic such film is at least one of the group consisting of polyester resins, acetate resins, polyether sulfone resins, polycarbonate resins, polyamide resins, polyimide resins, polyolefin resins, (meth)acrylic resins, polyvinyl chloride resins, polyvinylidene chloride resins, polystyrene resins, polyvinyl alcohol resins, polyarylate resins, and polyphenylene sulfide resins.

8. The method according to claim 1, wherein the total thickness of the transparent conductive laminate is 25 nm to 35 nm.

9. A method for producing a transparent conductive film, comprising:
heat-treating a transparent conductive film comprising a transparent film substrate and a transparent conductive laminate having a total thickness of 35 nm or less that is provided on at least one surface of the transparent film substrate and comprises a first transparent conductive layer and a second transparent conductive layer, so that the first and the second transparent conductive layers in the transparent conductive film are crystallized, wherein
the transparent film substrate is a transparent plastic film,
the thickness of the first transparent conductive layer is smaller than the thickness of the second transparent conductive layer,
a difference between the thickness of the first transparent conductive layer and the thickness of the second transparent conductive layer is 1 nm or more,
the thickness of the first transparent conductive layer is 1 to 17 nm, and the thickness of the second transparent conductive layer is 9 to 34 nm,
the first transparent conductive layer is a first amorphous layer comprising indium oxide or an indium-based complex oxide having a tetravalent metal element oxide,
a first content of the tetravalent metal element oxide of the first transparent conductive layer is more than 0% by weight and not more than 5% by weight,
the second transparent conductive layer is a second amorphous layer comprising an indium-based complex oxide having a tetravalent metal element oxide, and located between the transparent film substrate and the first transparent conductive layer, and
a second content of the tetravalent metal element oxide of the second transparent conductive layer is higher than the first content,
wherein each of the first and the second contents of the tetravalent metal element oxide content is expressed by the formula: {the amount of the tetravalent metal element oxide/(the amount of the tetravalent metal element oxide+the amount of indium oxide)}×100(%),
wherein a heating temperature in the heat-treating is from 120° C. to 150° C., and a heating time in the heat-treating is less than 60 minutes, forming a third transparent conductive layer that is located between the transparent film substrate and the second transparent conductive layer, and the third transparent conductive layer is a third crystalline layer,
the third transparent conductive layer directly contacts the substrate, the second transparent conductive layer directly contacts the opposite surface of the third transparent conductive layer, and the first transparent conductive layer directly contacts the opposite surface of the second transparent conductive layer.

10. The method according to claim 9, wherein the third transparent conductive layer comprises indium oxide or an indium-based complex oxide having a tetravalent metal element oxide, and
a third content of the tetravalent metal element oxide of the third transparent conductive layer is more than 0% by weight and not more than 6% by weight,
wherein the third content is expressed by the formula: {the amount of the tetravalent metal element oxide/(the amount of the tetravalent metal element oxide+the amount of indium oxide)}×100(%).

11. The method according to claim 9, wherein the transparent plastic such film is at least one of the group consisting of polyester resins, acetate resins, polyether sulfone resins, polycarbonate resins, polyamide resins, polyimide resins, polyolefin resins, (meth)acrylic resins, polyvinyl chloride resins, polyvinylidene chloride resins, polystyrene resins, polyvinyl alcohol resins, polyarylate resins, and polyphenylene sulfide resins.

12. The method according to claim 9, wherein the total thickness of the transparent conductive laminate is 25 nm to 35 nm.

* * * * *